(12) United States Patent
Tsai

(10) Patent No.: US 10,651,120 B1
(45) Date of Patent: May 12, 2020

(54) DISPLAY PANEL, DISPLAY MODULE, AND ELECTRONIC DEVICE

(71) Applicant: WUHAN CHINA STAR OPTOELECTRONICS SEMICONDUCTOR DISPLAY TECHNOLOGY CO., LTD., Wuhan, Hubei (CN)

(72) Inventor: Chewen Tsai, Hubei (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 16/326,207

(22) PCT Filed: Jan. 4, 2019

(86) PCT No.: PCT/CN2019/070488
§ 371 (c)(1),
(2) Date: Feb. 17, 2019

(30) Foreign Application Priority Data

Dec. 3, 2018 (CN) .......................... 2018 1 1463108

(51) Int. Cl.
*G02F 1/1333* (2006.01)
*H01L 23/498* (2006.01)
*H05K 5/00* (2006.01)

(52) U.S. Cl.
CPC .... *H01L 23/4985* (2013.01); *G02F 1/133305* (2013.01); *H05K 5/0017* (2013.01)

(58) Field of Classification Search
CPC . G06F 1/1652; G06F 1/1681; G06F 1/133305
See application file for complete search history.

(56) References Cited

U.S. PATENT DOCUMENTS

| 2008/0055831 | A1* | 3/2008 | Satoh | G02F 1/133305 |
| | | | | 361/600 |
| 2009/0219225 | A1* | 9/2009 | Cope | G09F 9/30 |
| | | | | 345/55 |
| 2013/0148312 | A1* | 6/2013 | Han | H05K 7/00 |
| | | | | 361/736 |
| 2013/0169515 | A1* | 7/2013 | Prushinskiy | G06F 1/1652 |
| | | | | 345/55 |
| 2014/0152646 | A1* | 6/2014 | Kang | G09G 3/2085 |
| | | | | 345/214 |
| 2014/0183473 | A1* | 7/2014 | Lee | H01L 51/0097 |
| | | | | 257/40 |

(Continued)

FOREIGN PATENT DOCUMENTS

| CN | 106856206 A | 6/2017 |
| CN | 206480628 U | 9/2017 |

(Continued)

*Primary Examiner* — Adrian S Wilson
(74) *Attorney, Agent, or Firm* — Mark M. Friedman

(57) ABSTRACT

A display panel, a display module, and an electronic device are provided. The display panel includes a flexible substrate. The flexible substrate includes a bending portion, and a position of the bending portion corresponds to a position of a bending area of the display panel. The bending portion is provided with at least one buffer hole, and a buffer material is provided in the buffer hole and on a rear surface of the bending portion.

17 Claims, 4 Drawing Sheets

(56) References Cited

U.S. PATENT DOCUMENTS

| | | | |
|---|---|---|---|
| 2014/0226275 A1* | 8/2014 | Ko | G06F 1/1626 |
| | | | 361/679.27 |
| 2016/0295685 A1* | 10/2016 | Ryu | G06F 1/1652 |
| 2017/0162821 A1* | 6/2017 | Oh | H01L 27/323 |
| 2018/0210505 A1 | 7/2018 | Chen et al. | |
| 2019/0041915 A1* | 2/2019 | Park | H01L 27/3276 |
| 2019/0157311 A1 | 5/2019 | Zhang | |
| 2019/0189640 A1 | 6/2019 | Huang et al. | |

FOREIGN PATENT DOCUMENTS

| | | |
|---|---|---|
| CN | 107644593 A | 1/2018 |
| CN | 107894681 A | 4/2018 |
| CN | 107946317 A | 4/2018 |
| CN | 207233319 U | 4/2018 |
| CN | 108447403 A | 8/2018 |
| CN | 108777112 A | 11/2018 |
| CN | 108831908 A | 11/2018 |
| CN | 108877515 A | 11/2018 |
| WO | 2018010059 A1 | 1/2018 |

\* cited by examiner

DISPLAY PANEL, DISPLAY MODULE, AND ELECTRONIC DEVICE

FIELD OF DISCLOSURE

The present disclosure relates to the field of display technologies, and in particular, to a display panel, a display module, and an electronic device.

BACKGROUND

A current display panel includes a display area, a bending area, and an out lead bonding (OLB) area. The display area is configured to display an image. The bending area is located between the display area and the OLB area. The bending area is provided with a plurality of wires.

To reduce a frame size of the panel, the bending area is usually bent, such that the OLB area is bent to a rear surface of a screen to connect to a drive chip. However, the wires in the bending area are easily damaged due to a large stress during a bending process, thereby decreasing display performance.

Therefore, it is necessary to provide a display panel, a display module, and an electronic device, to solve a problem in the prior art.

SUMMARY OF DISCLOSURE

An object of the present disclosure is to provide a display panel, a display module, and an electronic device, to reduce a stress during a bending process, thereby preventing wires in a bending area from being broken.

To solve the foregoing technical problem, the present disclosure provides a display panel, including:

a flexible substrate including a bending portion, where a position of the bending portion corresponds to a position of a bending area of the display panel, the bending portion is provided with at least one buffer hole, and a buffer material is provided in the buffer hole and on a rear surface of the bending portion.

In the display panel of the present disclosure, at least a part of the rear surface of the bending portion is provided with the buffer hole.

In the display panel of the present disclosure, the display panel further includes a display area and an out lead bonding area, and the bending area is located between the display area and the out lead bonding area.

A plurality of buffer holes are provided at two ends of the bending portion, one end of the bending portion is close to the display area, and another end of the bending portion is close to the out lead bonding area.

In the display panel of the present disclosure, the buffer material is provided at least in a set area on the rear surface of the bending portion, and a position of the set area corresponds to a position of the buffer hole.

In the display panel of the present disclosure, two adjacent buffer holes overlap each other.

In the display panel in the present disclosure, two adjacent buffer holes are spaced apart from each other.

In the display panel of the present disclosure, the buffer material includes at least one of glue and a polymer material.

In the display panel in the present disclosure, the buffer hole includes a through hole or a blind hole.

In the display panel of the present disclosure, a shape of a longitudinal cross section of the buffer hole includes at least one of a rectangle, a triangle, a trapezoid, and a polygon.

The present disclosure provides a display module, including any one of the foregoing display panels.

The present disclosure provides an electronic device, including the foregoing display module.

According to the display panel, the display module, and the electronic device in the present disclosure, the bending portion of the flexible substrate is provided with at least one buffer hole, and the buffer material is provided in the buffer hole and on the rear surface of the bending portion, such that a stress in a bending process is reduced, to prevent wires in the bending area from being broken.

DETAILED DESCRIPTION

Figure 1:
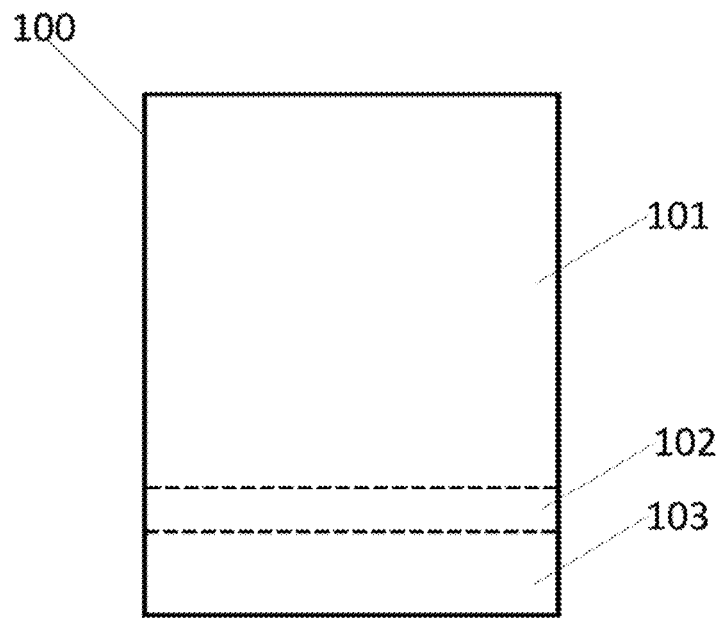
FIG. 1 is a top view of a display panel according to the present disclosure.

The following embodiments are described with reference to the accompanying drawings, and are used to exemplify particular embodiments that the present disclosure can be used to implement. Direction terms mentioned in the present disclosure such as "upper", "lower", "front", "rear", "left", "right", "inner", "outer", and "side" are only directions with reference to the accompanying drawings. Therefore, the used direction terms are intended to describe and understand the present disclosure, but are not intended to limit the present disclosure. In the drawings, units whose structures are the same are indicated by using the same reference numbers.

Referring to FIG. 1 to FIG. 11, FIG. 1 is a top view of a display panel according to the present disclosure.

Figure 2:
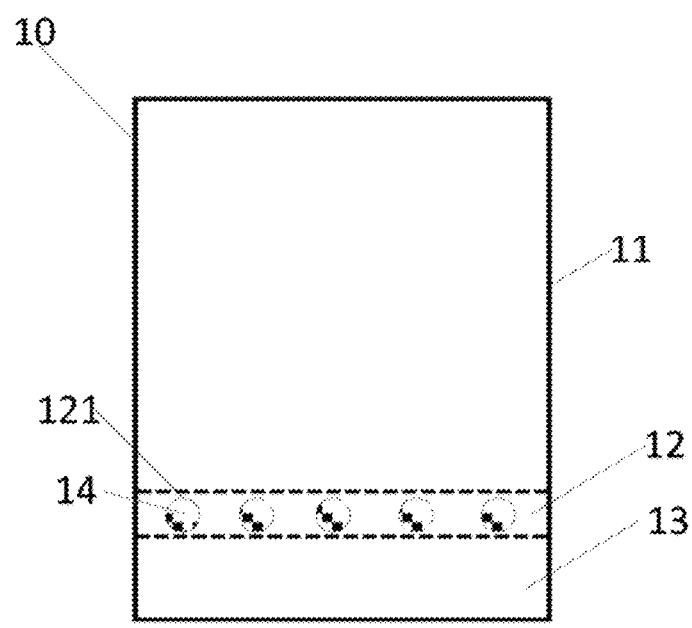
FIG. 2 is a top view of a flexible substrate according to the present disclosure.

As shown in FIG. 1, in the top view, a display panel 100 of the present disclosure includes a display area 101, a bending area 102, and an out lead bonding area 103. The bending area 102 is an area that can be bent and may be in a planar state or a bent state. In a specific manufacture process, the bending area 102 of the display panel is bent to connect the out lead bonding area 103 to a drive chip on a rear surface of the display panel. With reference to FIG. 2, a cross sectional structure of the display panel 100 includes a flexible substrate 10.

Figure 10:
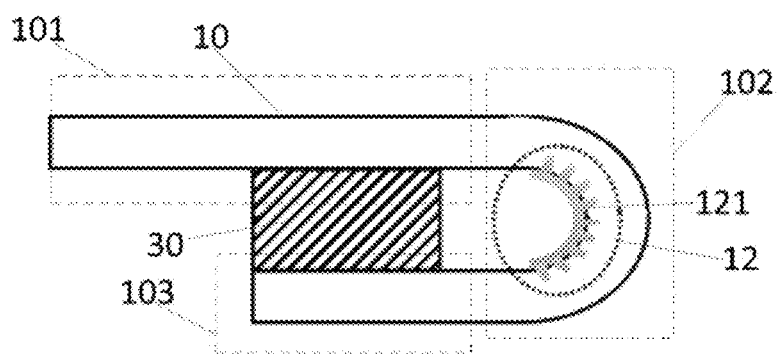
FIG. 10 is a first schematic structural diagram of a flexible substrate after bending according to the present disclosure.
Figure 11:
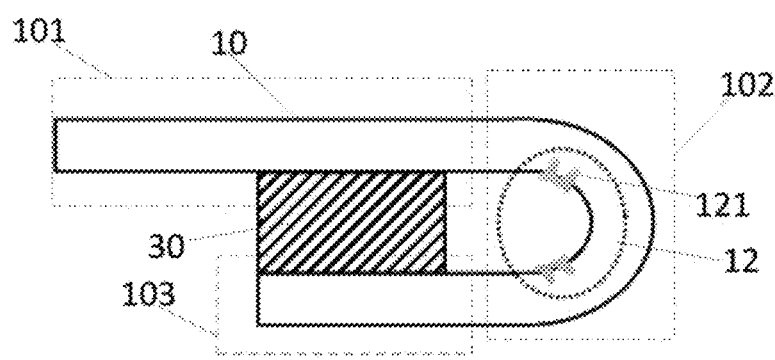
FIG. 11 is a second schematic structural diagram of a flexible substrate after bending according to the present disclosure.

As shown in FIG. 2, the flexible substrate 10 includes an upper portion 11, a bending portion 12, and a lower portion 13. The upper portion 11 corresponds to a position of the display area 101. The lower portion 13 corresponds to a position of the out lead bonding area 103. The bending portion 12 corresponds to a position of the bending area 102. With reference to FIG. 10 and FIG. 11, the bending portion 12 is provided with at least one buffer hole 121. For example, a plurality of buffer holes 121 are provided on a lower portion of the bending portion 12 (that is, on the rear surface, close to a side of a glass substrate). It may be understood that a thin film transistor is disposed above the bending portion 12 (on a front surface).

Figure 3:
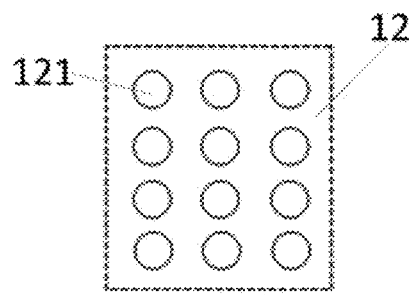
FIG. 3 is a first top view of a bending portion of a flexible substrate according to the present disclosure.
Figure 4:
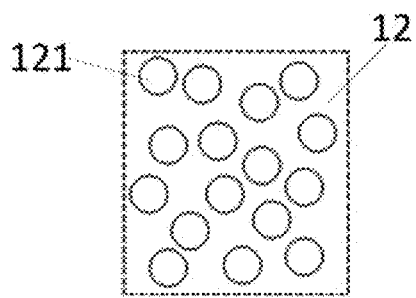
FIG. 4 is a second top view of a bending portion of a flexible substrate according to the present disclosure.
Figure 5:
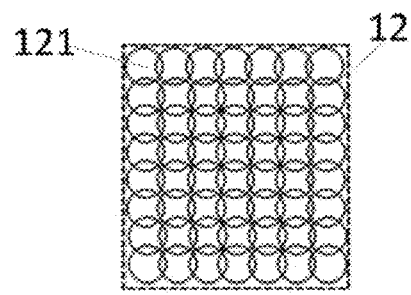
FIG. 5 is a third top view of a bending portion of a flexible substrate according to the present disclosure.

In an embodiment, as shown in FIG. 3, the buffer holes 121 are regularly arranged. For example, the buffer holes 121 are arranged at equal intervals. In another embodiment, as shown in FIG. 4, the buffer holes 121 are irregularly arranged. For example, the buffer holes 121 are dispersedly arranged. In another embodiment, as shown in FIG. 5, two adjacent buffer holes 121 overlap each other. The two adjacent buffer holes 121 partially overlap each other. In another embodiment, some of the buffer holes 121 overlap each other. Certainly, it may be understood that an arrangement manner of the buffer holes 121 is not limited to the foregoing several manners.

Figure 6:
FIG. 6 is a top view of buffer holes according to the present disclosure.
Figure 7:
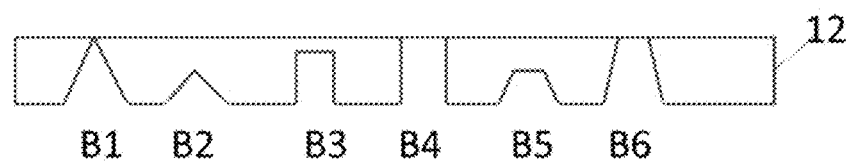
FIG. 7 is a cross sectional view of a buffer hole in a flexible substrate according to the present disclosure.

As shown in FIG. 6, in the top view, top-view shapes of the buffer holes 121 are shown by A1 to A6, and the top-view shapes may be a circle, a triangle, a rectangle, a pentagon, a polygon, or the like. As shown in FIG. 7, structures of a longitudinal cross section of the buffer holes 121 are shown by B1 to B6. Shapes of the longitudinal cross section may be a triangle, a rectangle, a trapezoid, or the like, and certainly, may be other shapes, for example, a polygon or a semicircle.

The buffer hole 121 may be a blind hole or a through hole. When the buffer hole 121 is a blind hole, a top portion of the buffer hole is not in contact with an upper surface of the flexible substrate.

Figure 9:
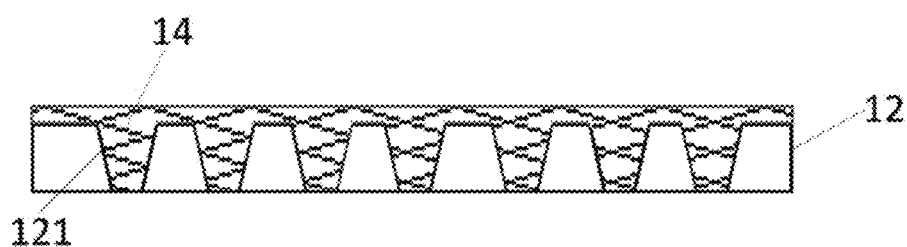
FIG. 9 is a schematic structural diagram showing a third step of a method for manufacturing a flexible substrate according to the present disclosure.

With reference to FIG. 9 to FIG. 11, a buffer material 14 is filled in the buffer holes 121 and on the lower portion of the bending portion 12 (on the rear surface). At least a set area (not shown) on the rear surface of the bending portion 12 is provided with the buffer material 14. The set area corresponds to a position of the buffer hole 121. In an embodiment, as shown in FIG. 10, when an entire rear surface of the bending portion 12 is provided with the buffer holes 121, the buffer material 14 is provided on the entire rear surface of the bending portion 12. In another embodiment, as shown in FIG. 11, when a part of the rear surface of the bending portion 12 is provided with the buffer holes 121, the buffer material 14 is provided on the rear surface of the bending portion 12 that corresponds to the buffer holes 121. Preferably, an area of an orthographic projection of the buffer material 14 on the rear surface of the bending portion 12 that is on the flexible substrate 10 is greater than or equal to an area of an orthographic projection of the buffer hole 121 on the flexible substrate 10. Certainly, it may be understood that when the part of the rear surface of the bending portion 12 is provided with the buffer holes 121, the buffer material 14 may be provided on the entire rear surface of the bending portion 12.

A method for manufacturing a substrate of the present disclosure includes the following steps.

S101, the buffer hole 121 is formed on the rear surface of the bending portion 12.

For example, the buffer hole 121 is formed through mechanical processing, etch processing, or laser processing. The etch may be dry etch or wet etch.

A wavelength that may be used for the laser processing includes at least one of 343 nm, 355 nm, 515 nm, 532 nm, 1030 nm, and 1064 nm. Used laser may be a solid-state laser or an ultra-fast pulsed laser.

S102, a filling material is coated in the buffer hole 121 and on the rear surface of the bending portion 12.

Figure 8:
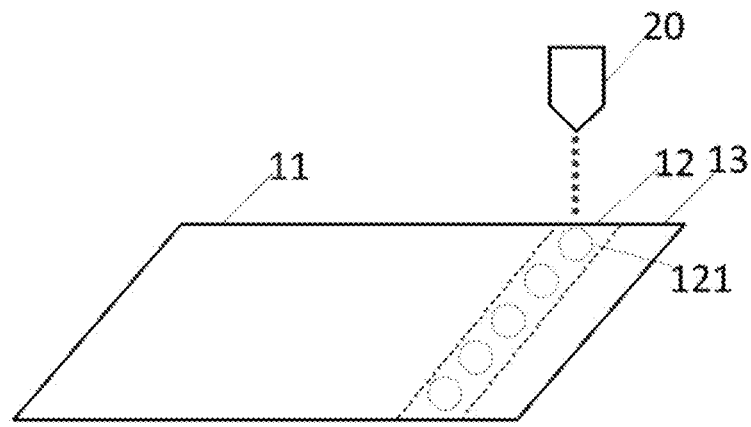
FIG. 8 is a schematic structural diagram showing a second step of a method for manufacturing a flexible substrate according to the present disclosure.

For example, as shown in FIG. 8, glue or a liquid polymer material is coated on the rear surface of the bending portion 12 by using a coating apparatus 20, to form a buffer layer in the buffer hole 121 and on the rear surface of the bending portion 12. The filling material includes the glue or the liquid polymer material. A coating manner may be one of slot die coating, inkjet printing, and dispensing.

S103, the filling material is cured.

As shown in FIG. 9, after the coating is completed, the bending portion 12 is baked or cured through illumination, to cure the filling material.

In an embodiment, a structure of the flexible substrate 10 after bending is shown in FIG. 10. The buffer holes 121 are provided on the lower portion of the entire bending portion 12 (on the rear surface). That is, the buffer holes 121 cover the entire bending portion 12. The display panel includes the bending area 101, the display area 102, and the out lead bonding area 103. A display module corresponding to the display panel further includes a backplane. The backplane is disposed on an inner side of the bent display panel. One end of the backplane is aligned with end portions of the display area 102 and the out lead bonding area 103, and the other end of the backplane exceeds a length range of a preset bending area between 0.2 mm and 0.5 mm. In an actual bending process, an actual bending area 102 is smaller than the preset bending area. Therefore, if the backplane exceeds the range of the preset bending area, the display panel can be better supported. A support member 30 is disposed between an inner side of the upper portion of the flexible substrate 10 and an inner side of the lower portion of the flexible substrate 10.

Bending stresses at two ends of the bending portion are relatively large. Therefore, to simplify a manufacture process, in another embodiment, a structure of the display panel after bending is shown in FIG. 11. At least a part of the rear surface of the bending portion 12 is provided with the buffer holes 121. That is, the buffer holes 121 are disposed on the lower portion of only a part of the bending portion 12. That is, the buffer holes 121 partially cover the lower portion of the bending portion 12. The buffer hole 121 are provided at two ends of the bending portion 12, one end of the bending portion 12 is close to the display area 101, and the other end of the bending portion 12 is close to the out lead bonding area 103.

The plurality of buffer holes are disposed on a bending portion, such that a stress during bending can be reduced, thereby preventing wires of the bending portion from being broken and improving the display performance. In addition, a condemnation rate of products is decreased, and production costs are reduced.

The present disclosure further provides a display module, including any one of the foregoing display panels.

The present disclosure further provides an electronic device, including the foregoing display module.

According to the display panel, the display module, and the electronic device in the present disclosure, the bending portion of the flexible substrate is provided with at least one buffer hole, and the buffer material is provided in the buffer hole and on the rear surface of the bending portion, such that a stress in a bending process is reduced, to prevent wires in the bending area from being broken.

To sum up, although the present disclosure is disclosed above with reference to preferred embodiments, the preferred embodiments are not intended to limit the present disclosure. Those of ordinary skill in the art may make various variations and modifications without departing from the spirit and scope of the present disclosure. Therefore, the protection scope of the present disclosure is subject to the scope defined by the claims.

What is claimed is:

1. A display panel, comprising:
    a flexible substrate comprising a bending portion, wherein a position of the bending portion corresponds to a position of a bending area of the display panel, the bending portion is provided with a plurality of buffer holes, and a buffer material is provided in the buffer holes and on a rear surface of the bending portion;
    a display area and an out lead bonding area, wherein the bending area is located between the display area and the out lead bonding area; and
    two of the buffer holes are provided at two ends of the bending portion, one end of the bending portion is adjacent to the display area, and another end of the bending portion is adjacent to the out lead bonding area.

2. The display panel as claimed in claim 1, wherein the buffer holes are spaced apart from each other, and a portion of the buffer material extends along the rear surface of the bending portion to connect to each of the buffer holes.

3. The display panel as claimed in claim 1, wherein the buffer material is provided at least in a set area on the rear surface of the bending portion, and a position of the set area corresponds to a position of the buffer hole.

4. The display panel as claimed in claim 1, wherein two adjacent buffer holes overlap each other.

5. The display panel as claimed in claim 1, wherein two adjacent buffer holes are spaced apart from each other.

6. The display panel as claimed in claim 1, wherein the buffer material comprises at least one of glue and a polymer material.

7. The display panel as claimed in claim 1, wherein the buffer hole comprises a through hole or a blind hole.

8. The display panel as claimed in claim 1, wherein a shape of a longitudinal cross section of the buffer hole comprises at least one of a rectangle, a triangle, a trapezoid, and a polygon.

9. A display module, comprising a display panel, wherein the display panel comprises:
    a flexible substrate comprising a bending portion, wherein a position of the bending portion corresponds to a position of a bending area of the display panel, the bending portion is provided with a plurality of buffer holes, and a buffer material is provided in the buffer holes and on a rear surface of the bending portion;
    a display area and an out lead bonding area, wherein the bending area is located between the display area and the out lead bonding area; and
    two of the buffer holes are provided at two ends of the bending portion, one end of the bending portion is adjacent to the display area, and another end of the bending portion is adjacent to the out lead bonding area.

10. The display panel as claimed in claim 9, wherein the buffer holes are spaced apart from each other, and a portion of the buffer material extends along the rear surface of the bending portion to connect to each of the buffer holes.

11. The display module as claimed in claim 10, wherein the display panel further comprises a display area and an out lead bonding area, and the bending area is located between the display area and the out lead bonding area; and
    a plurality of buffer holes are provided at two ends of the bending portion, one end of the bending portion is close to the display area, and another end of the bending portion is close to the out lead bonding area.

12. The display module as claimed in claim 9, wherein two adjacent buffer holes overlap each other.

13. The display module as claimed in claim 9, wherein two adjacent buffer holes are spaced apart from each other.

14. The display module as claimed in claim 9, wherein the buffer material comprises at least one of glue and a polymer material.

15. The display module as claimed in claim 9, wherein the buffer hole comprises a through hole or a blind hole.

16. An electronic device, comprising a display module, wherein the display module comprises a display panel, and the display panel comprises:
    a flexible substrate comprising a bending portion, wherein a position of the bending portion corresponds to a position of a bending area of the display panel, the bending portion is provided with a plurality of buffer holes, and a buffer material is provided in the buffer holes and on a rear surface of the bending portion;
    a display area and an out lead bonding area, wherein the bending area is located between the display area and the out lead bonding area; and
    two of the buffer holes are provided at two ends of the bending portion, one end of the bending portion is adjacent to the display area, and another end of the bending portion is adjacent to the out lead bonding area.

17. The display panel as claimed in claim 16, wherein the buffer holes are spaced apart from each other, and a portion of the buffer material extends along the rear surface of the bending portion to connect to each of the buffer holes.

* * * * *